(12) United States Patent
Bleeker (10) Patent No.: US 7,161,661 B2
(45) Date of Patent: Jan. 9, 2007

(54) LITHOGRAPHIC APPARATUS AND DEVICE MANUFACTURING METHOD

(75) Inventor: Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 98 days.

(21) Appl. No.: 10/895,999

(22) Filed: Jul. 22, 2004

(65) Prior Publication Data
US 2005/0024615 A1 Feb. 3, 2005

(30) Foreign Application Priority Data
Jul. 23, 2003 (EP) .................... 03254630

(51) Int. Cl.
G03B 27/72 (2006.01)
G03B 27/42 (2006.01)
G03B 27/54 (2006.01)

(52) U.S. Cl. .............................. 355/69; 355/53; 355/70
(58) Field of Classification Search .................. 355/53, 355/67–71; 250/492.2, 492.22; 372/52, 372/58
See application file for complete search history.

(56) References Cited

U.S. PATENT DOCUMENTS

| | | | |
|---|---|---|---|
| 4,719,640 A | 1/1988 | Chenausky et al. | |
| 6,215,808 B1 * | 4/2001 | Atsumi et al. | 372/58 |
| 6,233,039 B1 * | 5/2001 | Yen et al. | 355/53 |
| 6,312,134 B1 * | 11/2001 | Jain et al. | 359/855 |
| 6,570,168 B1 * | 5/2003 | Schultz et al. | 250/492.2 |
| 6,717,973 B1 * | 4/2004 | Basting et al. | 372/52 |
| 2002/0126479 A1 | 9/2002 | Zhai et al. | |
| 2003/0219094 A1 | 11/2003 | Basting et al. | |

OTHER PUBLICATIONS

Malov A.N. et al, "Excimer laser with two simultaneously excited active media," Soviet Physics Technical Physics, 1985, No. 4, 393-5. XP-000712093.

European Search Report for Application No. 03254630.1-1226, dated Jun. 24, 2004.

* cited by examiner

*Primary Examiner*—Henry Hung Nguyen
(74) *Attorney, Agent, or Firm*—Pillsbury Winthrop Shaw Pittman, LLP (57) ABSTRACT

In one embodiment, a pulse-to-pulse dose reproducibility of a radiation system for use in maskless lithography is improved by providing a plurality of lasers and combining the radiation beams produced by each to form a single projection beam of radiation.

29 Claims, 4 Drawing Sheets

PRIOR ART

Fig. 3

PRIOR ART

LITHOGRAPHIC APPARATUS AND DEVICE MANUFACTURING METHOD

RELATED APPLICATIONS

This application is based on European patent application 03254630.1, filed Jul. 23, 2003, the entire contents of which is hereby incorporated by reference.

FIELD OF THE INVENTION

The present invention relates to radiation sources, lithographic apparatus, and device manufacturing methods.

BACKGROUND INFORMATION

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning structure, which is alternatively referred to as a mask or a reticle, may be used to generate a circuit pattern corresponding to an individual layer of the IC (or other device), and this pattern can be imaged onto a target portion (e.g. comprising part of, one or several dies) on a substrate (e.g. a silicon wafer or glass plate) that has a layer of radiation-sensitive material (resist). Instead of a mask, the patterning structure may comprise an array of individually controllable elements which serve to generate the circuit pattern.

The term "array of individually controllable elements" as here employed should be broadly interpreted as referring to any device that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning device include:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices can also be used in a corresponding manner. Each diffractive optical MEMS device may be comprised of, for example, a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using one or more suitable electronic devices. In both of the situations described hereabove, the array of individually controllable elements can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference.

A programmable LCD array. An example of such a construction is given in United States Patent U.S. Pat. No. 5,229,872, which is incorporated herein by reference.

It should be appreciated that where pre-biasing of features, optical proximity correction features, phase variation techniques and multiple exposure techniques are used, for example, the pattern "displayed" on the array of individually controllable elements may differ (possibly substantially) from the pattern eventually transferred to a layer of or on the substrate. Similarly, the pattern eventually generated on the substrate may not correspond to the pattern formed at any one instant on the array of individually controllable elements. This may be the case, for example, in an arrangement in which the eventual pattern formed on each part of the substrate is built up over a given period of time or a given number of exposures during which the pattern on the array of individually controllable elements and/or the relative position of the substrate changes.

In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 408, 355, 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The radiation system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

When performing lithography using an apparatus with an array of individually controllable elements, so-called maskless lithography, it may be important to ensure that the intensity of the radiation produced by the radiation system does not vary significantly over a sequence of exposures. For example, the pulse-to-pulse dose reproducibility required may be approximately 1%. However, lasers that are presently used for lithography do not achieve this level of pulse-to-pulse dose reproducibility. In particular, presently used excimer lasers have a pulse-to-pulse dose reproducibility of only about 10%.

SUMMARY

A lithographic apparatus according to one embodiment of the invention comprises a radiation system for supplying a projection beam of radiation; an array of individually controllable elements serving to impart the projection beam with a pattern in its cross-section; a substrate table configured to supporting a substrate; and a projection system configured to project the patterned beam onto a target portion of the substrate. The radiation system comprises a plurality of radiation generating units, each producing a sub-projection beam of radiation, and a combining unit configured to combine each of the sub-projection beams to form the projection beam of radiation. The plurality of radiation generating units may be, for example, lasers contained in a single housing that share a common lasing medium.

In one embodiment, each of the radiation generating units produce radiation at substantially the same wavelength. This feature may be applied, for example, to produce a projection beam of radiation with a narrow spectrum.

The radiation generating units within the housing may each comprise a pair of independent discharge electrodes. Alternatively, these radiation generating units may share one common discharge electrode.

The housing containing several radiation generating units may also contain a blower for mixing the laser gas within the housing and/or a temperature controller for regulating the temperature of the laser gas (e.g. for convenience). In at least some embodiments, the complexity of the radiation system is further minimised by sharing such utilities.

The radiation system may contain a plurality of housings, each containing a plurality of the radiation generating units, sharing some or all utilities. Such an arrangement may be used to permit a large number of radiation generating units to be incorporated in the radiation system, without increasing the complexity of each housing.

Additionally, the radiation system may comprise a plurality of radiation generating units that are independent lasers.

Some or all of the radiation generating units may share a common control system (e.g. in order to reduce the complexity of the radiation system).

The sub-projection beams produced by each of the radiation generating units may be combined to form the projection beam of radiation using a diffractive element or a micro lens array.

According to another embodiment of the invention, there is provided a radiation source configured to provide a projection beam of radiation for a lithographic apparatus. The radiation source comprises a plurality of radiation generating units, each producing a sub-projection beam of radiation; and a combining unit that combines each of the sub-projection beams to form a projection beam of radiation. The plurality of radiation generating units may be, for example, lasers contained in a single housing that share a common lasing medium.

A device manufacturing method according to another embodiment comprises providing a substrate; providing a projection beam of radiation using a radiation system comprising a plurality of radiation generating units; using an array of individually controllable elements to impart the projection beam with a pattern in its cross-section; and projecting the patterned beam of radiation onto a target portion of the substrate. The method further comprises using the radiation generating units to provide a plurality of sub-projection beams of radiation and combining them to provide the projection beam of radiation. The plurality of radiation generating units are lasers which are contained in a single housing that share a common lasing medium.

A device manufacturing method according to a further embodiment comprises using a plurality of radiation generating units to generate a respective plurality of distinct beams of radiation; combining said plurality of distinct beams of radiation into a projection beam of radiation; using an array of individually controllable elements to impart the projection beam with a pattern in its cross-section; and projecting the patterned projection beam onto a target portion of a substrate. At least two of the respective plurality of distinct beams of radiation are laser beams generated concurrently from the same lasing medium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

At least some embodiments may be applied to provide a radiation source for maskless lithography with an improved pulse-to-pulse dose reproducibility.

Figure 1:
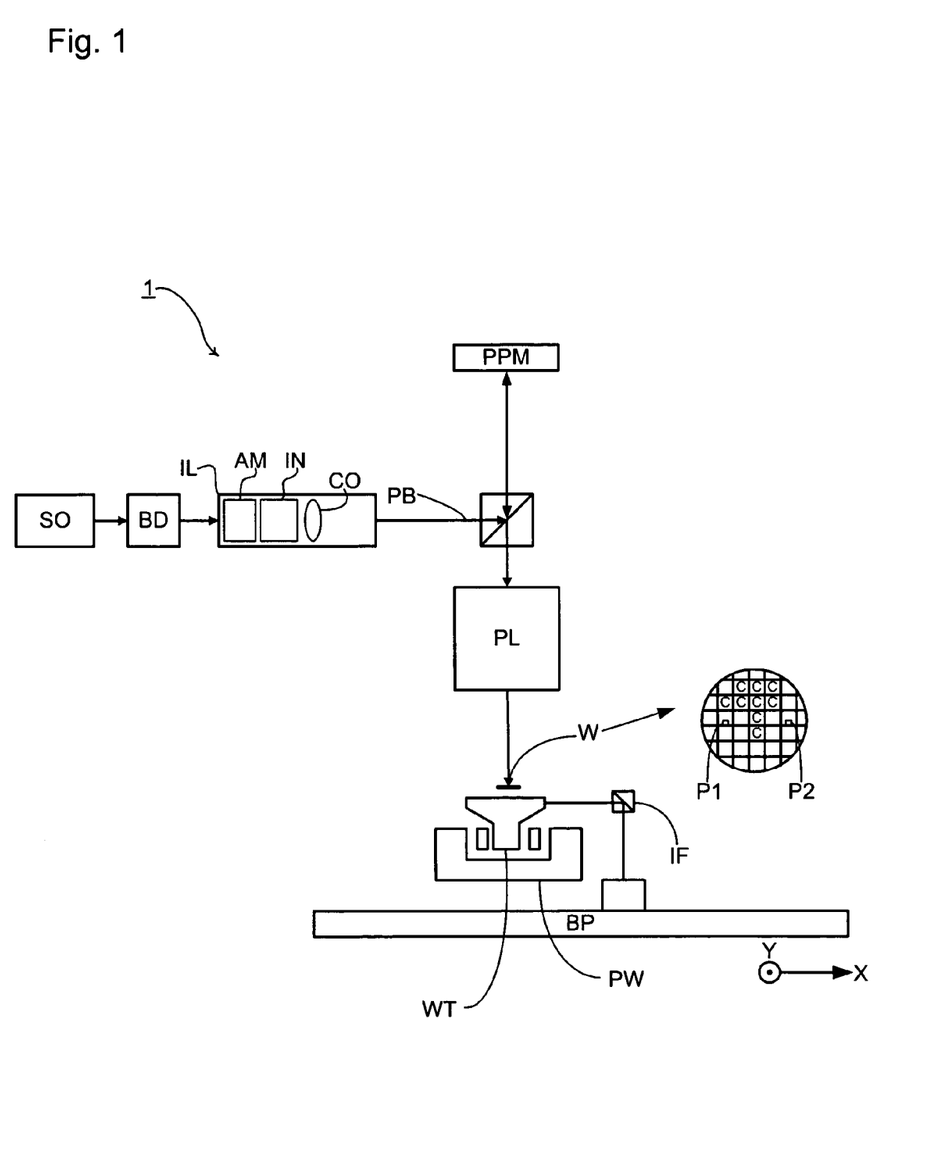
FIG. 1 depicts a lithographic apparatus according to an embodiment of the invention.

FIG. 1 schematically depicts a lithographic projection apparatus according to an embodiment of the invention. The apparatus comprises:

- an illumination system (illuminator) IL configured to provide a projection beam PB of radiation (e.g. UV radiation);
- an array of individually controllable elements PPM (e.g. a programmable mirror array) configured to apply a pattern to the projection beam. In general, the position of the array of individually controllable elements will be fixed relative to item PL. However it may instead be connected to a positioning device to accurately position the array of individually controllable elements with respect to item PL;
- a substrate table (e.g. a wafer table) WT configured to support a substrate (e.g. a resist-coated wafer) W, and connected to positioning device PW to accurately position the substrate with respect to item PL; and
- a projection system ("lens") PL configured to image a pattern imparted to the projection beam PB by the array of individually controllable elements PPM onto a target portion C (e.g. comprising one or more dies) of the substrate W. The projection system may image the array of individually controllable elements onto the substrate. Alternatively, the projection system may image secondary sources for which the elements of the array of individually controllable elements act as shutters. The projection system may also comprise an array of focusing elements such as a micro lens array (known as an MLA) or a Fresnel lens array, e.g. to form the secondary sources and to image microspots onto the substrate.

As here depicted, the apparatus is of a reflective type (i.e. has a reflective array of individually controllable elements). However, in general, it may also be of a transmissive type, for example (i.e. with a transmissive array of individually controllable elements).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise adjusting element(s) AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning device PW (and interferometric measuring device IF), the substrate table WT can be moved accurately, e.g. so as to position different target portions C in the path of the beam PB. Where used, the positioning device for the array of individually controllable elements can be used to accurately correct the position of the array of individually controllable elements PPM with respect to the path of the beam PB, e.g. during a scan. In general, movement of the object table WT is realized with the aid of a long-stroke module (coarse positioning) and a short-stroke module (fine positioning), which are not explicitly depicted in FIG. 1. A similar system may also be used to position the array of individually controllable elements. It will be appreciated that the projection beam may alternatively/additionally be moveable while the object table and/or the array of individually controllable elements may have a fixed position to provide the required relative movement. As a further alternative, that may be especially applicable in the manufacture of flat panel displays, the position of the substrate table and the projection system may be fixed and the substrate may be arranged to be moved relative to the substrate table. For example, the substrate table may be provided with a system for scanning the substrate across it at a substantially constant velocity.

Although a lithographic apparatus according to an embodiment of the invention is herein described as being for exposing a resist on a substrate, it will be appreciated that principles of the invention are not limited to this use, and that embodiments of such an apparatus may be used to project a patterned projection beam for use in resistless lithography.

Embodiments of the depicted apparatus can be used in one or more of four preferred modes:

1. Step mode: the array of individually controllable elements imparts an entire pattern to the projection beam, which is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements is movable in a given direction (the so-called "scan direction", e.g. the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the array of individually controllable elements is updated as the projection beam scans across the substrate and exposes it.

Combinations and/or variations on the above described modes of use or entirely different modes of use may also be employed.

Figure 2:
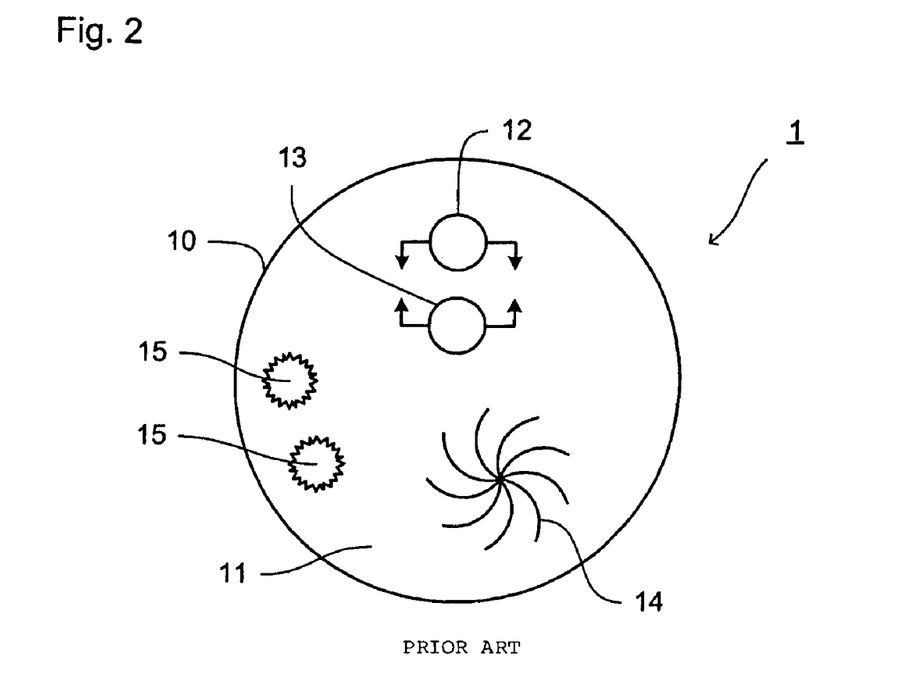
FIG. 2 depicts, in cross-section, an excimer laser.
Figure 3:
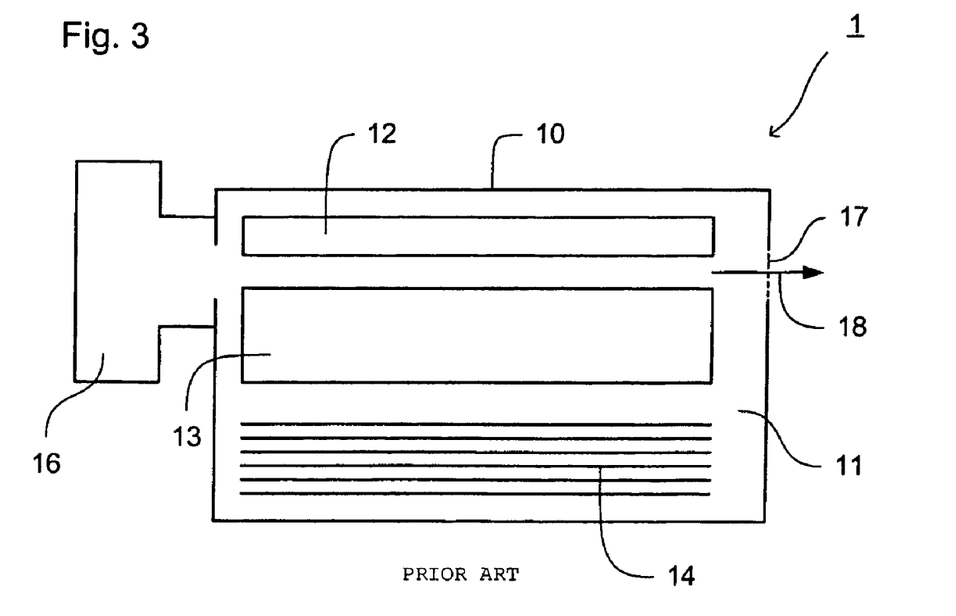
FIG. 3 depicts a side view of an excimer laser.

FIGS. 2 and 3 depict a conventional gas discharge laser 1, for example an excimer laser, in cross-section and side elevation, respectively. The gas laser 1 has a housing 10 in which is contained the laser gas 11 (which in the case of an excimer laser may be for example XeF). Within the laser gas are a pair of discharge electrodes 12,13, a blower 14 for mixing the laser gas 11 in the housing 10 so that it is evenly distributed, and temperature controllers 15 to regulate the temperature of the laser gas. At one end of the laser 1 there is a mirror or line-width narrowing unit 16 and at the opposite end there is a semi-transparent mirror 17 from which the beam of laser radiation 18 is projected.

In a radiation system according to an embodiment of the present invention, a plurality of radiation generating units are provided that each produce a sub-projection beam of radiation. Each of the sub-projection beams of radiation are then combined to form the projection beam of radiation which is used to expose the substrate.

Figure 4:
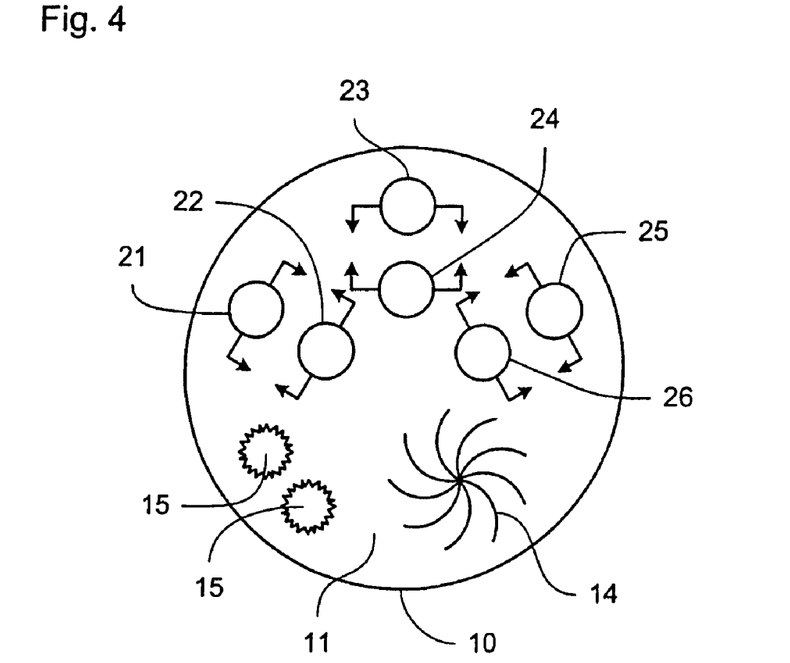
FIG. 4 depicts, in cross-section, a multi-laser unit according to an embodiment of the present invention.
Figure 5:
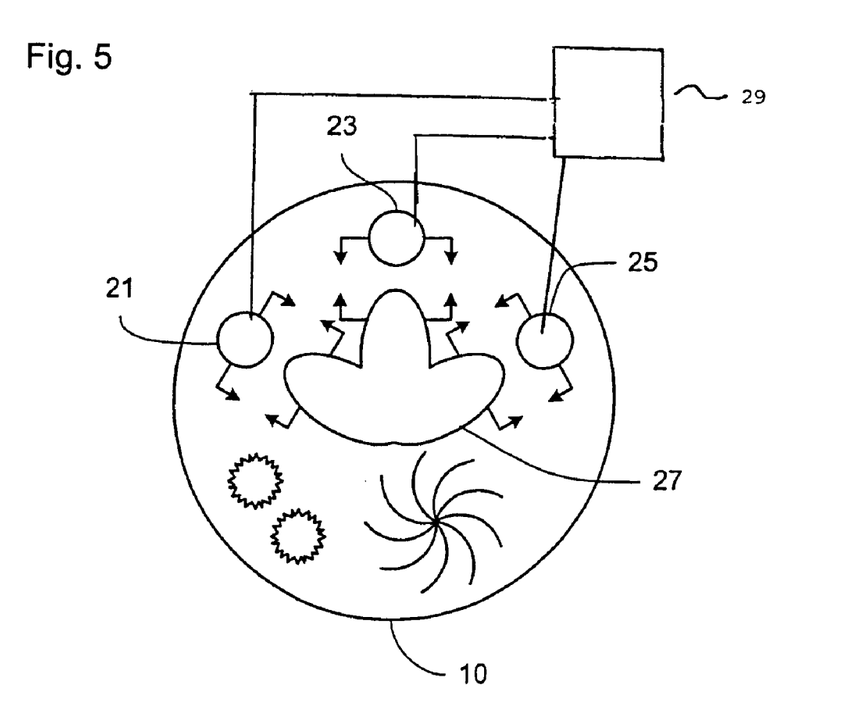
FIG. 5 depicts, in cross-section, a variant of the multi-laser unit shown in FIG. 4.
Figure 6:
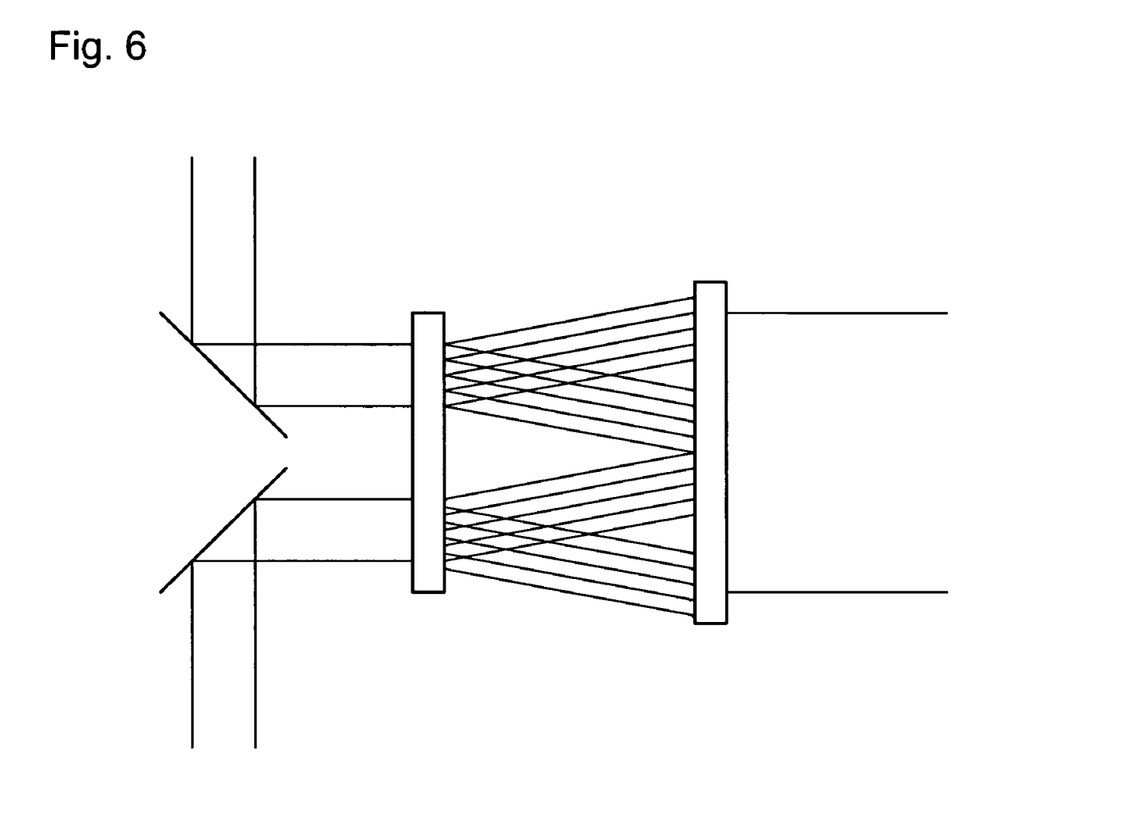
FIG. 6 depicts an example of a beam combining unit that may be used in an embodiment of the present invention.

Some of the radiation generating units may be an independent laser (e.g. of conventional design). However, in an arrangement according to an embodiment of the present invention, some of the radiation generating units share a common housing and a common lasing medium. FIGS. 4 and 5 illustrate, in cross-section, an example of such an arrangement.

In the arrangement shown in FIG. 4, three radiation generating units are enclosed within a single common housing 10 that contains a laser gas 11 that the radiation generating units share between them. The housing also contains a blower 14 and temperature control elements 15. Each radiation generating unit is comprised of a pair of discharge electrodes 21,22; 23,24; 25,26. Each pair of discharge electrodes generates a laser beam of radiation that is projected from a semi-transparent mirror at an end of the housing. It will be appreciated that there may be separate semi-transparent mirrors associated with each pair of discharge electrodes (and hence each sub-projection laser beam of radiation) or, alternatively, some or all of the pairs of discharge electrodes may project their associated laser beams of radiation through a common semi-transparent mirror.

The arrangement shown in FIG. 5 corresponds to that of FIG. 4, except that one of the discharge electrodes of each of the radiation generating units is replaced by a common discharge electrode 27. Consequently, each radiation generating unit is comprised of one independent discharge electrode 21,23,25 and a portion of the common discharge electrode 27.

FIGS. 4 and 5 both show arrangements in which three radiation generating units are contained in a single housing 10. It will be appreciated, however, that the housings may contain any practical number of radiation generating units. Furthermore, the complete radiation system of an embodiment of the present invention may be made up of any number of such housings. In general, the radiation system may be comprised of one or more such housings that each may contain one or more radiation generating units, such that the complete radiation system contains a plurality of radiation generating units. In addition, it is to be understood that it is not an essential feature of the invention for the radiation generating units within a single housing to have a common blower or common temperature control units.

In order to minimize the complexity of the radiation system, some or all of the radiation generating units may share common control electronics (see element 29 of FIG. 5) that are used to govern the timing of the pulses of radiation generated by the radiation generating units. Moreover, some or all of the radiation generating units may be independent lasers. Controlling the timing of independent lasers may be more complicated. However, because the lasers are entirely independent, the radiation intensity of each laser is also entirely independent, and therefore the pulse-to-pulse dose reproducibility of the radiation system as a whole may be improved.

In at least some embodiments, even if the pulse-to-pulse dose reproducibility of each of the radiation generating units is not good enough for use in maskless lithography, the variations average out such that the output of the complete radiation system is a projection beam of radiation with sufficient pulse-to-pulse dose reproducibility for use in maskless lithography. Furthermore, although each of the radiation generating units within the housing produces a laser pulse independently, the complexity of the radiation system as a whole is minimised.

When using a laser source of radiation in a lithographic projection apparatus, it may be necessary to reduce the coherence of the laser beam, e.g. because the field uniformity may otherwise be affected due to speckle. It is therefore conventional to project the laser beam of radiation through an integrator, as described above in relation to FIG. 1. In an embodiment of the present invention, the combined projection beam of radiation may be projected through an integrator. Alternatively and/or additionally at least one of the sub-projection beams of radiation produced by the individual radiation generating units may be projected through an integrator prior to being combined into the projection beam of radiation in the combining unit. Alternatively, if the radiation system contains a sufficient number of radiation generating units, the coherence of the projection beam of radiation produced by combining the sub-projection beams from each of the radiation generating units may be inherently low enough that an integrator is not required.

In one embodiment, at least one hundred radiation generating units are used. With this number of radiation generating units, the coherence of the resulting projection beam of radiation is typically sufficiently low that no integrator is required. Furthermore, the pulse-to-pulse dose reproducibility may be improved (e.g. by up to a factor of ten) in comparison to a single radiation generating unit of the type used. Such an improvement may render the pulse-to-pulse dose reproducibility of a system using excimer lasers adequate for use in, for example, maskless lithography.

In general, the greater the number of radiation generating units used, the greater the improvement in pulse-to-pulse dose reproducibility. Using conventional excimer lasers, one hundred or more radiation generating units may be used.

It may be necessary to ensure that all of the radiation generating units produce pulses simultaneously, e.g. in order to avoid pulse timing errors and to prevent the radiation pulse being spread over a longer time duration. In order to achieve such a result, it may be desirable or necessary for each of the radiation generating units, or at least each group of radiation generating units contained within a single housing, to be provided with its own timing circuitry to compensate for its specific timing characteristic. Such circuits may need to be calibrated, and the calibration may need to be repeated periodically.

While specific embodiments have been described above, it will be appreciated that the invention may be practiced otherwise than as described. In addition, embodiments also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A lithographic apparatus comprising:
   a radiation system configured to supply a projection beam of radiation, said radiation system comprising:
      a plurality of lasers that are contained in a single housing and that share a common lasing medium, each of said lasers being configured to produce a respective sub-projection beam of radiation, and
      a combining unit configured to form said projection beam of radiation based on the sub-projection beams;
   an array of individually controllable elements configured to impart the projection beam with a pattern in its cross-section;
   a substrate table configured to support a substrate; and
   a projection system configured to project the patterned beam onto a target portion of the substrate,
   wherein each of said plurality of lasers comprises a respective pair of discharge electrodes distinct from the discharge electrodes of the others of the plurality of lasers.

2. The lithographic apparatus according to claim 1, wherein each of the respective sub-projection beams has substantially the same wavelength as the other respective sub-projection beams.

3. The lithographic apparatus according to claim 1, wherein said housing contains at least one of a blower configured to mix a gaseous lasing medium in the housing and a temperature controller configured to regulate a temperature of the gaseous lasing medium in the housing.

4. The lithographic apparatus according to claim 1, wherein said radiation system comprises a plurality of housings, each housing containing a plurality of lasers sharing a common gaseous lasing medium.

5. The lithographic apparatus according to claim 1, wherein said radiation system includes a plurality of independent lasers.

6. The lithographic apparatus according to claim 1, wherein said plurality of lasers share a common timing control system.

7. The lithographic apparatus according to claim 1, wherein said combining unit includes at least one of a diffractive element and a micro lens array.

8. The lithographic apparatus according to claim 1, wherein said radiation system comprises at least one hundred lasers.

9. A lithographic apparatus comprising:
   a radiation system configured to supply a projection beam of radiation, said radiation system comprising:
      a plurality of lasers that are contained in a single housing and that share a common lasing medium, each of said lasers being configured to produce a respective sub-projection beam of radiation, and
      a combining unit configured to form said projection beam of radiation based on the sub-projection beams;
   an array of individually controllable elements configured to impart the projection beam with a pattern in its cross-section;
   a substrate table configured to support a substrate; and
   a projection system configured to project the patterned beam onto a target portion of the substrate,
   wherein said plurality of lasers share a common discharge electrode, and
   wherein each of said plurality of lasers further comprises a discharge electrode distinct from a discharge electrode of the others of the plurality of lasers.

10. A radiation source configured to provide a projection beam of radiation for a lithographic apparatus, said radiation source comprising:
    a plurality of lasers that are contained in a single housing and that share a common lasing medium, each of said plurality of lasers being configured to produce a respective sub-projection beam of radiation; and
    a combining unit configured to form a projection beam of radiation based on the sub-projection beams,
    wherein each of said plurality of lasers comprises a respective pair of discharge electrodes distinct from the discharge electrodes of the others of the plurality of lasers.

11. The radiation source according to claim 10, wherein each of the respective sub-projection beams has substantially the same wavelength as the other respective sub-projection beams.

12. The radiation source according to claim 10, the radiation source further comprising one or more additional housings, each of the one or more additional housings containing a plurality of lasers sharing a common gaseous lasing medium.

13. The radiation source according to claim 10, wherein said radiation source comprises at least one hundred lasers.

14. The radiation source according to claim 10, wherein said common lasing medium is gaseous.

15. The radiation source according to claim 10, wherein said plurality of lasers is configured to provide said sub-projection beams concurrently.

16. The radiation source according to claim 10, wherein said combining unit includes at least one of a diffractive element and a micro lens array.

17. A radiation source configured to provide a projection beam of radiation for a lithographic apparatus, said radiation source comprising:
    a plurality of lasers that are contained in a single housing and that share a common lasing medium, each of said plurality of lasers being configured to produce a respective sub-projection beam of radiation; and
    a combining unit configured to form a projection beam of radiation based on the sub-projection beams,
    wherein said plurality of lasers share a common discharge electrode, and
    wherein each of said plurality of lasers further comprises a discharge electrode distinct from a discharge electrode of the others of the plurality of lasers.

18. A device manufacturing method comprising:
using a radiation system to provide a beam of radiation;
using an array of individually controllable elements to impart the beam with a pattern in its cross-section; and
projecting the patterned beam onto a target portion of a substrate,
wherein said radiation system comprises a plurality of lasers that are contained in a single housing and that share a common lasing medium,
wherein said using a radiation system comprises using each of said plurality of lasers to provide a respective sub-beam of radiation, and combining the sub-beams to form said beam of radiation, and
wherein each of said plurality of lasers comprises a respective pair of discharge electrodes distinct from the discharge electrodes of the others of the plurality of lasers.

19. The device manufacturing method according to claim 18, wherein each of the respective sub-projection beams has substantially the same wavelength as the other respective sub-projection beams.

20. The device manufacturing method according to claim 18, wherein said common lasing medium is gaseous, radiation source comprises a plurality of housings, each housing containing a plurality of lasers sharing a common gaseous lasing medium.

21. The device manufacturing method according to claim 18, wherein said radiation system comprises at least one hundred lasers.

22. The device manufacturing method according to claim 18, wherein said common lasing medium is gaseous.

23. A device manufacturing method comprising:
using a radiation system to provide a beam of radiation;
using an array of individually controllable elements to impart the beam with a Pattern in its cross-section; and
projecting the patterned beam onto a target portion of a substrate,
wherein said radiation system comprises a plurality of lasers that are contained in a single housing and that share a common lasing medium,
wherein said using a radiation system comprises using each of said plurality of lasers to provide a respective sub-beam of radiation, and combining the sub-beams to form said beam of radiation, and
wherein said plurality of lasers share a common discharge electrode.

24. A device manufacturing method comprising:
using a plurality of lasers to generate a respective plurality of distinct beams of radiation;
combining said plurality of distinct beams of radiation into a projection beam of radiation;
using an array of individually controllable elements to impart the projection beam with a pattern in its cross-section; and
projecting the patterned projection beam onto a target portion of a substrate,
wherein at least two of the respective plurality of distinct beams of radiation are generated concurrently from the same lasing medium, and
wherein each of said respective plurality of distinct beams is generated using a respective distinct pair of discharge electrodes.

25. The device manufacturing method according to claim 24, wherein each of said respective plurality of distinct beams has substantially the same wavelength as the others of said respective plurality of distinct beams.

26. The device manufacturing method according to claim 24, wherein said respective plurality of distinct beams comprises a first set of distinct beams generated using a first common lasing medium and a second set of distinct beams generated using a second common lasing medium distinct from said first common lasing medium.

27. The device manufacturing method according to claim 24, wherein said plurality of lasers comprises at least one hundred lasers.

28. The device manufacturing method according to claim 24, wherein said lasing medium is gaseous.

29. A device manufacturing method comprising:
using a plurality of lasers to generate a respective plurality of distinct beams of radiation;
combining said plurality of distinct beams of radiation into a projection beam of radiation;
using an array of individually controllable elements to impart the projection beam with a pattern in its cross-section; and
projecting the patterned projection beam onto a target portion of a substrate,
wherein at least two of the respective plurality of distinct beams of radiation are generated concurrently from the same lasing medium, and
wherein each of said respective plurality of distinct beams is generated using a common discharge electrode.

* * * * *